United States Patent
Fairchild et al.

(10) Patent No.: US 7,439,083 B2
(45) Date of Patent: Oct. 21, 2008

(54) TECHNIQUE FOR COMPENSATING FOR SUBSTRATE SHRINKAGE DURING MANUFACTURE OF AN ELECTRONIC ASSEMBLY

(75) Inventors: M. Ray Fairchild, Kokomo, IN (US); Jerome L. Badgett, Russia Ville, IN (US)

(73) Assignee: Delphi Technologies, Inc., Troy, MI (US)

( * ) Notice: Subject to any disclaimer, the term of this patent is extended or adjusted under 35 U.S.C. 154(b) by 615 days.

(21) Appl. No.: 11/105,927

(22) Filed: Apr. 14, 2005

(65) Prior Publication Data

US 2006/0234424 A1    Oct. 19, 2006

(51) Int. Cl.
*H01L 21/66* (2006.01)
*H01L 23/58* (2006.01)

(52) U.S. Cl. .......................... 438/14; 438/18; 438/401; 257/48; 257/772; 257/797; 257/E21.529

(58) Field of Classification Search ....................... None
See application file for complete search history.

(56) References Cited

U.S. PATENT DOCUMENTS

| 5,162,240 A | 11/1992 | Saitou et al. |
| 5,385,289 A | 1/1995 | Bloch et al. |
| 6,635,549 B2 * | 10/2003 | Kyoh et al. ..................... 430/5 |
| 6,963,389 B2 * | 11/2005 | Fukada ........................ 355/53 |
| 2001/0049589 A1 * | 12/2001 | Yasuda et al. ............... 702/150 |

FOREIGN PATENT DOCUMENTS

| DE | 3305325 | 5/1984 |
| WO | 0239326 | 5/2002 |

OTHER PUBLICATIONS

EP Search Report dated Jul. 6, 2007.

\* cited by examiner

*Primary Examiner*—Alonzo Chambliss
(74) *Attorney, Agent, or Firm*—Jimmy L. Funke

(57) ABSTRACT

Substrate shrinkage that occurs during manufacture of an electronic assembly is compensated for by the incorporation of a horizontal line, having a plurality of vertical graduations, across a horizontal portion of a substrate and a vertical line, having a plurality of horizontal graduations, across a vertical portion of the substrate. The substrate is then cured and an amount of substrate shrinkage is determined, based upon a location change in the graduations of the horizontal and vertical lines. In this manner, solder can be properly provided on solder pads of the substrate responsive to the amount of substrate shrinkage. As such, electronic components can be properly mounted to the solder pads of the substrate.

19 Claims, 4 Drawing Sheets

TECHNIQUE FOR COMPENSATING FOR SUBSTRATE SHRINKAGE DURING MANUFACTURE OF AN ELECTRONIC ASSEMBLY

TECHNICAL FIELD

The present invention is generally directed to an electronic assembly and, more specifically, to a technique for compensating for substrate shrinkage during manufacture of an electronic assembly.

BACKGROUND OF THE INVENTION

Substrates of electronic assemblies are made of a variety of materials that are subject to shrinkage, when the substrates are cured. For example, the green tape for low-temperature co-fired ceramic (LTCC) substrates shrinks upon firing, which can result in difficulty in precisely locating solder pads for proper printing of flux and solder on the solder pads. Furthermore, solder/flux stencil design has not taken into account the variation in substrate shrinkage across the substrate and within specific regions of the substrate. In general, the amount of substrate shrinkage has been predicted from an expected shrinkage, based on materials used and the process steps implemented.

In a typical case, substrate shrinkage can result in a plus or minus 0.4 percent uncertainty, e.g., about twenty mils over a five inch substrate, in the location of a particular solder pad. On circuits built on larger substrate panels, e.g., six inch by six inch panels, the shrinkage of the substrate material may result in unacceptable product builds. This is especially true where large panels are structured in an array-type format. In general, current substrate shrinkage compensation techniques utilize post-firing substrate measurements to correct an initial 1:1 artwork used to create a solder stencil. In this manner, the overall solder stencil artwork is corrected for the substrate shrinkage globally. However, the solder stencil artwork is not corrected for non-uniform shrinkage, which may be caused by a metallization difference, across the substrate.

With reference to FIG. 1, a relevant portion of a prior art substrate 10 is depicted that includes a plurality of conductive traces 12 that are coupled to solder pads 14 and 16. As is shown in FIG. 1, solder 14A has been misprinted such that it is only partially located on the pads 14. Similarly, solder 16A has been misprinted such that it only partially touches the solder pad 16. While such misregistered solder prints may provide a functional electronic assembly, depending upon the type of electronic components utilized in the assembly, a misaligned solder stencil may cause an electronic assembly that utilizes fine lead pitch electronic components, e.g., components having a pitch of about twenty mils or less, to be defective.

What is needed is a technique for compensating for substrate shrinkage during manufacture of an electronic assembly that prevents improper solder placement.

SUMMARY OF THE INVENTION

The present invention is generally directed to a technique for compensating for substrate shrinkage during manufacture of an electronic assembly. According to the technique, a horizontal line, having a plurality of vertical graduations, is provided across a horizontal portion of a substrate. A vertical line, having a plurality of horizontal graduations, is also provided across a vertical portion of the substrate. The substrate is then cured and an amount of shrinkage of the substrate is determined, based upon a location change in the graduations of the horizontal and vertical lines. Thus, solder can be provided on solder pads of the substrate responsive to the amount of substrate shrinkage. As such, electronic components can be properly mounted to the solder pads of the substrate.

According to one aspect of the present invention, the horizontal and vertical lines may be formed in a top level metal layer of the substrate. According to a different aspect of the present invention, the horizontal and vertical lines provide an indication of a global shrinkage of the substrate, a local shrinkage of the substrate and a shrinkage of the substrate at each of the electronic components. The horizontal line may include two graduated parallel horizontal lines and the vertical line may include two graduated parallel vertical lines, with the parallel horizontal lines and the parallel vertical lines framing the substrate.

According to one embodiment of the present invention, the substrate is a low-temperature co-fired ceramic (LTCC) substrate. The substrate may have various dimensions. For example, the substrate may have a dimension of about six inches by six inches or greater. According to another aspect of the present invention, flux is also provided on the solder pads of the substrate responsive to the amount of substrate shrinkage. prior to providing solder on the solder pads.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to one embodiment of the present invention, a top metal layer of a substrate is configured to include a frame made up of graduated lines. The graduated lines (markers) are used to obtain X and Y coordinate measurements to assist in determining the overall substrate shrinkage, the amount of substrate shrinkage at different locations across the substrate and the amount of substrate shrinkage at various component locations. According to the present invention, coordinate data may then be gathered, on a random sample basis, from multiple substrates, e.g., low-temperature co-fired ceramic (LTCC) substrates, to form a basis for solder and flux location adjustment.

Thus, through the use of the X and Y coordinate data obtained from the markers, the solder or flux stencil can be modified, to improve the fit to the component pads on a component-by-component basis. The modified stencil is then corrected for both the overall shrinkage of the substrate and for the local substrate shrinkage variations, caused by, for example, internal metal loading within the substrate. Thus, implementing the present invention allows for corrected solder print and placement of fine pitch electronic components. The corrected artwork for the flux and solder placement is then developed, based upon the obtained shrinkage measurements. Assuming the design of the substrate has been frozen and the processing of the substrate is controlled, the gridlines may be eliminated and other control features may be chosen.

Figure 1:
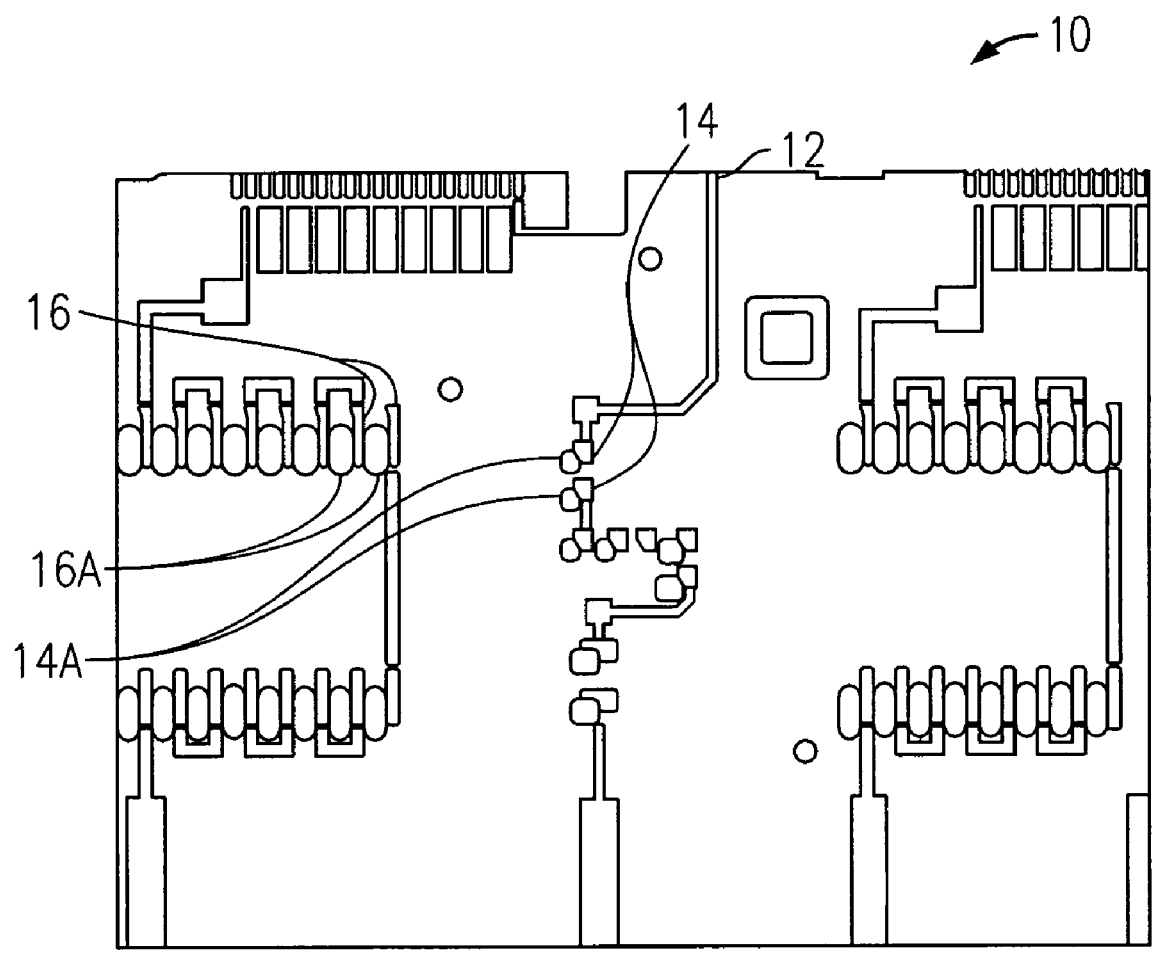
FIG. 1 is a top view of a relevant portion of an exemplary prior art substrate with mis-registered solder.
Figure 2:
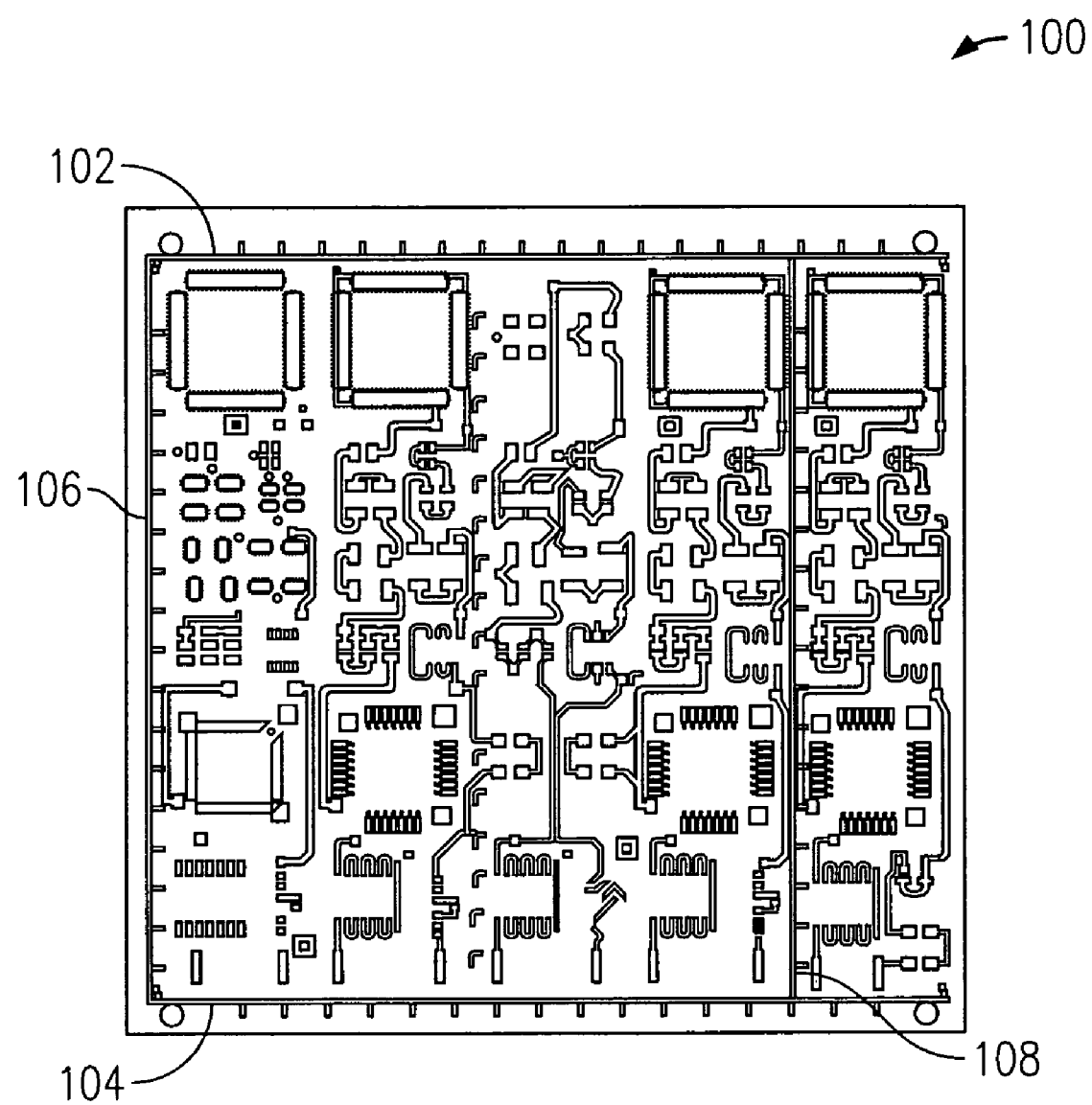
FIG. 2 is a top view of a substrate of an electronic assembly that includes a horizontal line, having a plurality of vertical graduations, and a vertical line, having a plurality of horizontal graduations, both of which are utilized to compensate for substrate shrinkage, according to the present invention.

FIG. 2 depicts a top view of an exemplary substrate 100 including a first graduated horizontal line 102 and a second graduated horizontal line 104. The substrate 100 also includes a first graduated vertical line 106 and a second graduated vertical line 108. As is shown, the horizontal lines 102 and 104 include spaced marks oriented in a vertical direction. Similarly, the vertical lines 106 and 108 include horizontal-spaced marks. The horizontal and vertical marks may be spaced, for example, every one-eighth of an inch. As is mentioned above, the marks are used to determine the amount of substrate 100 shrinkage that has occurred after curing, e.g., after firing.

Figure 3:
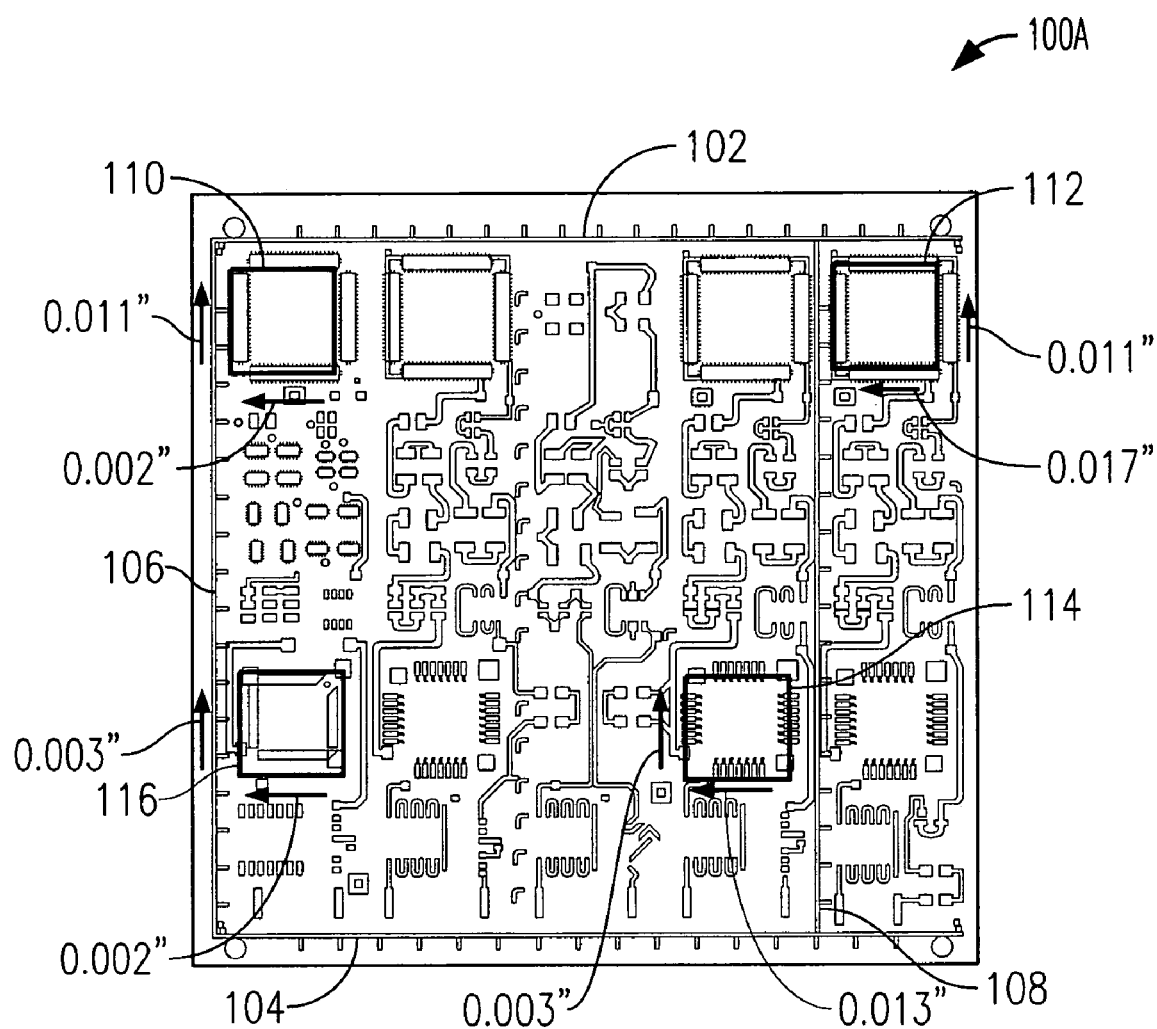
FIG. 3 is a top view of a relevant portion of the substrate of FIG. 2, depicting mounting of various components onto the substrate, based upon local adjustments for component location, due to local shrinkage of the substrate.

With reference to FIG. 3, the re-location, based upon the substrate 100 shrinkage after firing, of a number of electronic components 110, 112, 114 and 116 on the substrate 100, of electronic assembly 100A, is further depicted. As is shown in FIG. 3, the location of the solder paste for the component 110 is adjusted upward by eleven-thousandths of an inch and to the left by two-thousandths of an inch. Similarly, the solder paste for the electronic component 112 is adjusted upward by eleven-thousandths of an inch and to the left by seventeen-thousandths of an inch. Likewise, the solder paste for the electronic component 116 is adjusted upward by three-thousandths of an inch and to the left by two-thousandths of an inch. Finally, the solder paste for the component 114 is adjusted upward by three-thousandths of an inch and to the left by thirteen-thousandths of an inch. Thus, implementing the substrate shrinkage compensation technique of the present invention allows the components 110-116 to be independently adjusted, as needed, to compensate for local shrinkage of the substrate 100 at different locations.

Figure 4:
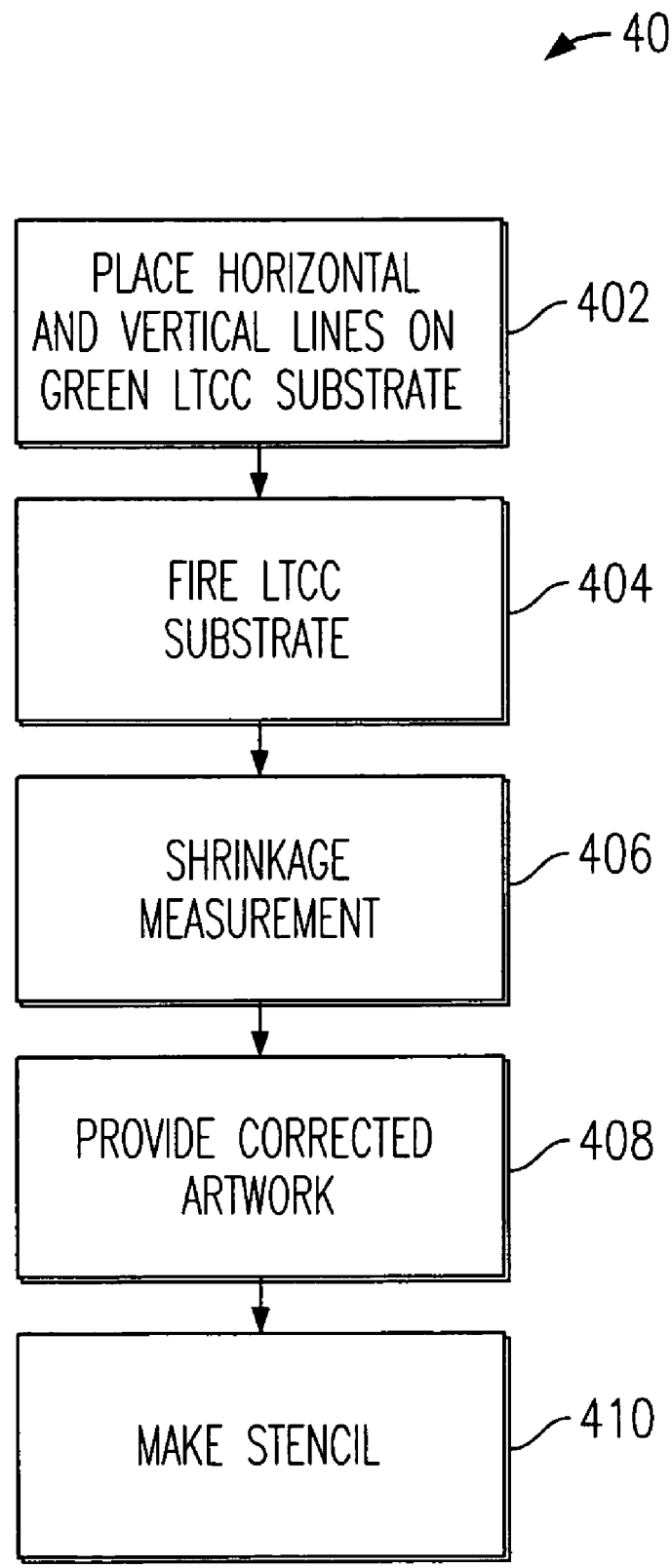
FIG. 4 is a flow chart of an exemplary process for implementing one embodiment of the present invention.

FIG. 4 depicts an exemplary process 400 for a green substrate, e.g., a green low-temperature co-fired ceramic (LTCC) substrate. In step 402, a plurality of one or more horizontal and vertical lines are placed in a top metal level of a green LTCC substrate. Next, in step 404, the LTCC substrate is fired. Then, in step 406, shrinkage measurements are taken to determine both global and local shrinkage. As noted above, a random sample of several substrates may be used to determine appropriate corrections. Next, in step 408, the artwork associated with the solder and/or flux stencil is corrected. Finally, in step 410, the shrinkage compensated solder/flux stencil is produced for use in manufacture of the electronic assembly.

Accordingly, a technique has been disclosed herein that allows for local shrinkage compensation of a substrate. This is advantageous as it reduces scrap, as well as rework, of an electronic assembly.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for compensating for substrate shrinkage during manufacture of an electronic assembly, comprising the steps of:
   providing a horizontal line having a plurality of vertical graduations across a horizontal portion of a substrate;
   providing a vertical line having a plurality of horizontal graduations across a vertical portion of the substrate;
   curing the substrate;
   determining an amount of shrinkage of the substrate based upon a location change in the graduations of the horizontal and vertical lines;
   providing solder on solder pads of the substrate responsive to the amount of substrate shrinkage; and
   mounting electronic components to the solder pads.

2. The method of claim 1, wherein the horizontal and vertical lines are formed in a top level metal layer of the substrate.

3. The method of claim 1, wherein the horizontal and vertical lines provide an indication of a global shrinkage of the substrate, a local shrinkage of the substrate and a shrinkage of the substrate where each of the electronic components are placed.

4. The method of claim 1, wherein the horizontal line includes two graduated parallel horizontal lines and the vertical line includes two graduated parallel vertical lines, and wherein the horizontal and vertical lines frame the substrate.

5. The method of claim 1, wherein the substrate is a low-temperature co-fired ceramic (LTCC) substrate.

6. The method of claim 1, wherein the substrate has dimensions of about six inches by six inches or greater.

7. The method of claim 1, further comprising the step of:
   providing flux on the solder pads of the substrate responsive to the amount of substrate shrinkage prior to providing solder on the solder pads.

8. A method for compensating for substrate shrinkage during manufacture of an electronic assembly, comprising the steps of:
   providing a horizontal line having a plurality of vertical graduations across a horizontal portion of a substrate;
   providing a vertical line having a plurality of horizontal graduations across a vertical portion of the substrate;
   curing the substrate;
   determining an amount of shrinkage of the substrate based upon a location change in the graduations of the horizontal and vertical lines; and
   providing flux on solder pads of the substrate responsive to the determined amount of shrinkage of the substrate, wherein the substrate is a low-temperature co-fired ceramic (LTCC) substrate, and wherein the horizontal and vertical lines are formed in a metal layer of the substrate.

9. The method of claim 8, further comprising the step of:
   providing solder on the solder pads of the substrate responsive to the amount of substrate shrinkage prior to providing solder on the solder pads.

10. The method of claim 9, further comprising the step of:
    mounting electronic components to the solder pads.

11. The method of claim 10, wherein the horizontal and vertical lines provide an indication of a global shrinkage of the substrate, a local shrinkage of the substrate and a shrinkage of the substrate where each of the electronic components are placed.

12. The method of claim 8, wherein the horizontal line includes two graduated parallel horizontal lines and the vertical line includes two graduated parallel vertical lines, and wherein the horizontal and vertical lines frame the substrate.

13. The method of claim 8, wherein the substrate has dimensions of about six inches by six inches or greater.

14. An electronic assembly with substrate shrinkage compensation, comprising:
- a substrate having a horizontal line having a plurality of vertical graduations across a horizontal portion of a substrate and vertical line having a plurality of horizontal graduations across a vertical portion of the substrate, wherein the substrate includes a plurality of solder pads formed on at least one surface of the substrate; and
- a plurality of electronic components coupled to one or more of the solder pads, wherein an amount of substrate shrinkage is determined based upon a location change in the graduations of the horizontal and vertical lines and a solder that electrically connects the electronic components to the solder pads is deposited on the solder pads responsive to the amount of substrate shrinkage.

15. The assembly of claim 14, wherein the substrate is a low-temperature co-fired ceramic (LTCC) substrate.

16. The assembly of claim 14, wherein the horizontal and vertical lines are formed in a metal layer of the substrate.

17. The assembly of claim 14, wherein the horizontal and vertical lines provide an indication of a global shrinkage of the substrate, a local shrinkage of the substrate and a shrinkage of the substrate where each of the electronic components are placed.

18. The assembly of claim 14, wherein the horizontal line includes two graduated parallel horizontal lines and the vertical line includes two graduated parallel vertical lines, and wherein the horizontal and vertical lines form a frame on the substrate.

19. The assembly of claim 14, wherein the substrate has dimensions of about six inches by six inches or greater.

* * * * *